United States Patent
Echizenya

(10) Patent No.: US 11,299,818 B2
(45) Date of Patent: Apr. 12, 2022

(54) METHOD FOR PRODUCING PBTIO$_3$-CONTAINING SINGLE CRYSTAL

(71) Applicant: JFE MINERAL COMPANY, LTD., Tokyo (JP)

(72) Inventor: Kazuhiko Echizenya, Tokyo (JP)

(73) Assignee: JFE MINERAL COMPANY, LTD., Tokyo (JP)

( * ) Notice: Subject to any disclaimer, the term of this patent is extended or adjusted under 35 U.S.C. 154(b) by 113 days.

(21) Appl. No.: 16/312,109

(22) PCT Filed: Jun. 28, 2017

(86) PCT No.: PCT/JP2017/023678
§ 371 (c)(1),
(2) Date: Dec. 20, 2018

(87) PCT Pub. No.: WO2018/047445
PCT Pub. Date: Mar. 15, 2018

(65) Prior Publication Data
US 2019/0226116 A1   Jul. 25, 2019

(30) Foreign Application Priority Data
Sep. 12, 2016 (JP) .............................. JP2016-177368

(51) Int. Cl.
| C30B 11/04 | (2006.01) |
| C30B 11/02 | (2006.01) |
| C30B 29/32 | (2006.01) |
| C30B 11/00 | (2006.01) |

(52) U.S. Cl.
CPC .............. *C30B 11/02* (2013.01); *C30B 11/00* (2013.01); *C30B 29/32* (2013.01)

(58) Field of Classification Search
CPC .............................. C30B 11/001; C30B 11/04
See application file for complete search history.

(56) References Cited

U.S. PATENT DOCUMENTS

| 2003/0154911 A1* | 8/2003 | Eissler .................... C30B 29/32 |
| | | 117/81 |
| 2016/0251773 A1* | 9/2016 | Han ...................... C30B 11/001 |
| | | 252/62.9 PZ |

FOREIGN PATENT DOCUMENTS

| JP | H05-117073 A | 5/1993 |
| JP | 2000-016900 A | 1/2000 |

OTHER PUBLICATIONS

International Search Report, dated Aug. 8, 2017, from corresponding PCT application No. PCT/JP2017/023678.

* cited by examiner

*Primary Examiner* — Robert M Kunemund
(74) *Attorney, Agent, or Firm* — Nixon & Vanderhye

(57) ABSTRACT

Provided is a method for producing a single crystal, wherein compositional variations and defects in the single crystal can be prevented and a single crystal having uniform characteristics in the growth direction can be produced at high yield. In this method for producing a single crystal, a PbTiO3-containing single crystal is produced by the vertical Bridgman technique, wherein the thickness of a melt layer containing the melt in a crucible is at least 30 mm.

2 Claims, 2 Drawing Sheets

(a)

(b)

(c)

METHOD FOR PRODUCING PBTIO₃-CONTAINING SINGLE CRYSTAL

TECHNICAL FIELD

The present invention relates to a method for producing a single crystal containing $PbTiO_3$ by a vertical Bridgman method.

BACKGROUND ART

A single crystal containing $PbTiO_3$ such as $(1-x)Pb(Mg_{1/3}Nb_{2/3})O_3/xPbTiO_3$ (so-called PMN-PT) or $(1-x-y)Pb(In_{1/2}Nb_{1/2})O_3/yPb(Mg_{1/3}Nb_{2/3})O_3/xPbTiO_3$ (so-called PIN-PMN-PT) has excellent piezoelectric characteristics and is thus suitably used as a probe for ultrasonic diagnostic apparatus. The vertical Bridgman method is widely used as a method for obtaining such an industrially useful single crystal.

However, in the case of producing a single crystal of PMN-PT or PIN-PMN-PT by the vertical Bridgman method, there is a problem that compositional variation in single crystal is likely to occur due to segregation phenomenon of $PbTiO_3$. Therefore, various studies have been made on techniques for preventing compositional variation in single crystal.

For example, Patent Literature 1 discloses a technique for producing a single crystal by heating and melting a grain of a material (hereinafter referred to as a raw material) in a sub-crucible to obtain a melt, and while dropping the obtained melt to a melt layer formed in another crucible, unidirectionally solidifying the melt by a vertical Bridgman method. Patent Literature 1 states that by keeping the thickness of the melt layer constant, it is possible to prevent compositional variation due to segregation phenomenon at the time of producing a single crystal and to obtain a single crystal having uniform characteristics in a growth direction.

However, according to the studies of the present inventor, in producing a single crystal of PMN-PT or PIN-PMN-PT by the method shown in Patent Literature 1, when the melt layer is too thin even if the thickness of the melt layer is kept constant, defects (for example, voids, cracks, or the like) in single crystal occur, resulting in a new problem that the yield of the single crystal reduces.

CITATION LIST

Patent Literature

Patent Literature 1: JP H05-117073 A

SUMMARY OF INVENTION

Technical Problem

An object of the present invention is to solve problems of the prior art and to provide a single crystal production method which can prevent occurrence of defects of single crystal and also produce a single crystal having uniform characteristics (for example, relative permittivity and the like) in a growth direction with a high yield.

Solution to Problem

In order to solve the above problems, the present inventor has dropped a melt of a raw material for a single crystal containing $PbTiO_3$ to a melt layer in a crucible, unidirectionally solidified the melt while keeping the thickness of the melt layer constant, and investigated the relationship between defects in the single crystal and the thickness of the melt layer. Then, it has been found that when the thickness of the melt layer is less than 30 mm (especially 25 mm or less), defects are likely to occur in a single crystal produced by unidirectionally solidifying the melt from the melt layer.

The present invention has been made based on such findings.

That is, the present invention is a single crystal production method for producing a single crystal containing $PbTiO_3$ by a vertical Bridgman method while heating and melting a raw material to obtain a melt and supplying the melt, in which the single crystal is produced setting the thickness of a melt layer in which the melt is stored in a crucible to 30 mm or more.

In the single crystal production method of the present invention, the thickness of the melt layer is preferably set to 30 to 90 mm.

Advantageous Effects of Invention

According to the present invention, it is possible to prevent occurrence of defects in a single crystal and to produce a single crystal having uniform characteristics in a growth direction with a high yield, and thus industrially remarkable effects are exhibited.

DESCRIPTION OF EMBODIMENTS

Figure 1:
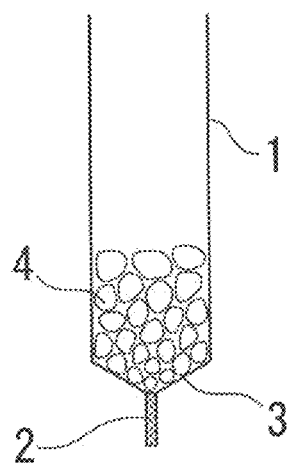
FIG. 1 is a cross-sectional view schematically showing an example of an apparatus for producing a single crystal by applying the present invention.
Figure 1:
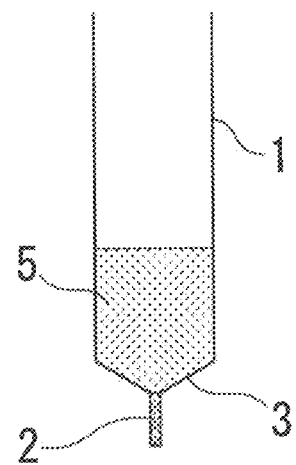
Figure 1:
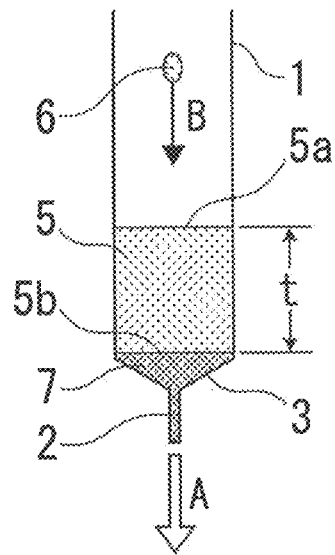

FIG. 1 is a cross-sectional view schematically showing an example of an apparatus for producing a single crystal by applying the present invention. In FIG. 1, reference numeral 1 denotes a crucible, reference numeral 3 denotes a conical portion (hereinafter referred to as a cone part) arranged at a lower part of the crucible 1, and reference numeral 2 denotes a seed crystal arranged at a lower end of the cone part 3.

In producing a single crystal by the vertical Bridgman method using an apparatus shown in FIG. 1, first, an initial raw material 4 is filled in the cone part 3 and an upper part thereof (see FIG. 1(a)). Next, the initial raw material 4 is heated and melted to form a melt layer 5 on the upper side of the seed crystal 2 (see FIG. 1(b)).

Figure 2:
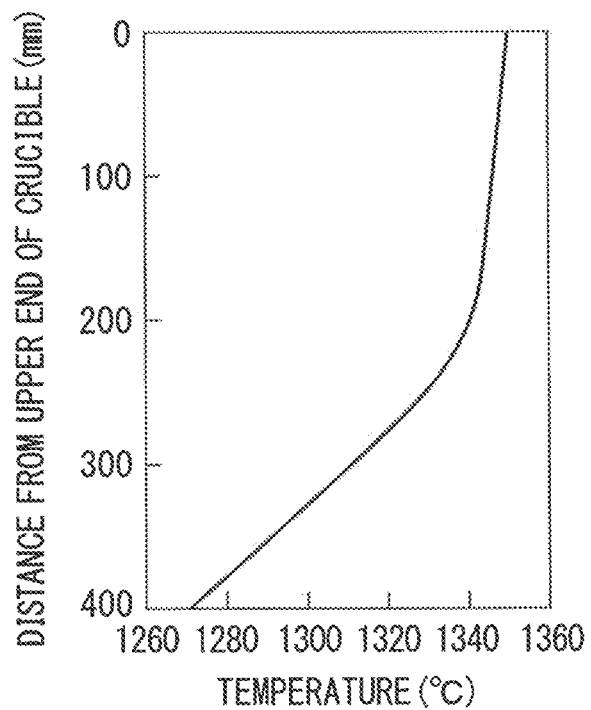
FIG. 2 is a graph showing an example of a temperature gradient of a crucible in FIG. 1.

Subsequently, in an environment having a temperature gradient in which the temperature at a lower section becomes lower (see FIG. 2), a melt 6 of a raw material for a single crystal 7 is dropped (arrow B) into the crucible 1 while lowering (arrow A) the crucible 1, as shown in FIG. 1(c). This melt 6 is obtained by heating and melting the raw material in a sub-crucible (not shown).

Thus, the melt layer 5 is unidirectionally solidified in the crucible 1 to produce a single crystal 7. At this time, a thickness t (mm) of the melt layer 5 can be kept constant by balancing the amount of the single crystal 7 unidirectionally solidified by lowering of the crucible 1 and the dropping amount of the melt 6. As a result, it is possible to prevent compositional variation and to obtain a single crystal 7 having uniform characteristics in a growth direction.

However, in the case of producing a single crystal 7 containing PbTiO$_3$ such as PMN-PT or PIN-PMN-PT, when the thickness t of the melt layer 5 is too thin, defects such as voids and cracks are likely to occur in the single crystal 7. Moreover, when these defects occur, the yield of the single crystal 7 reduces. Therefore, in the present invention, defects in the single crystal 7 are prevented, by setting the thickness t of the melt layer 5 to 30 mm or more. The thickness t of the melt layer 5 can be controlled by adjusting the filling amount of the initial raw material 4 and/or the dropping amount of the melt 6.

When the thickness t of the melt layer 5 is set to 30 mm or more, a distance between an upper surface 5a of the melt layer and a lower surface 5b of the melt layer (that is, single crystal growth interface) becomes longer. Therefore, it is possible to prevent PMN-PT or PIN-PMN-PT having a low Pb content (hereinafter referred to as low Pb material), that is considered to exist near the upper surface 5a of the melt layer, from reaching the lower surface 5b of the melt layer by convection or diffusion. As a result, it is possible to prevent the low Pb material from being taken into the single crystal 7, and eventually it is possible to prevent occurrence of defects in the single crystal 7.

On the other hand, when the thickness t of the melt layer 5 is too thick, a portion where the melt layer 5 is solidified without dropping the melt 6 at the end of the production process of the single crystal 7 becomes longer, and a region where the characteristics fluctuate is enlarged, thus the yield of the single crystal 7 reduces. Therefore, the thickness t of the melt layer 5 is preferably 90 mm or less.

EXAMPLES

A single crystal of 0.71 PMN-0.29 PT was produced by a vertical Bridgman method using an apparatus shown in FIG. 1, and then characteristics of the single crystal were examined. The procedure will be explained.

Grains having a composition of 0.66 PMN-0.34 PT as an initial raw material 4 were filled in a cone part 3 of a Pt-made crucible 1 having a cylindrical shape (diameter 80 mm, length 300 mm, cone part 20 mm) and an upper part thereof. The amount of the initial raw material 4 is as shown in Table 1.

Next, the initial raw material 4 in the crucible 1 was heated to 1350° C. and melted to form a melt layer 5 on an upper side of a seed crystal 2. The thickness t of the melt layer 5 is shown in Table 1.

Subsequently, the crucible 1 was lowered in an environment having a temperature gradient in which the temperature at a lower section becomes lower. By lowering the crucible 1, unidirectional solidification starts from a part coming into contact with the seed crystal 2 where the temperature has become lower than the melting point, and a single crystal 7 having the same crystal orientation as the seed crystal 2 grows upward. A melt up to an upper end face of the cone part 3 was solidified to form a melt layer 5 having a thickness t. The thickness t was adjusted by the amount of the initial raw material 4 as shown in Table 1.

Then, the melt 6 was dropped into the crucible 1, and the crucible 1 was lowered at a speed of 0.5 mm/hour while keeping the thickness t of the melt layer 5 constant. The melt 6 was obtained by heating and melting a raw material having a composition of 0.71 PMN-0.29 PT in a sub-crucible (not shown), and the supply rate by dropping of the melt 6 was 18 g/hour.

When the single crystal 7 was thus grown to a length of 220 mm, dropping of the melt 6 was stopped. Then the furnace was cooled down to room temperature. Here, the length of the single crystal is a length from an upper end of the cone part 3 of the crucible 1.

Subsequently, a wafer having a diameter of 80 mm was cut out from the obtained single crystal 7, and in order to evaluate the crystal quality, square substrates with a side of 10 mm were cut out as much as possible from a region without defects (voids, cracks), and the number of square substrates was examined. The results are shown in Table 1 as the number of square substrates. In Inventive Examples 1 to 3, since the thickness t of the melt layer 5 was 30 mm or more, 34 substrates could be cut out from one wafer.

On the other hand, in Comparative Examples 1 and 2, since the thickness t of the melt layer 5 was less than 30 mm, the number of substrates that could be cut out from one wafer greatly decreased. This means that a large number of defects existed in the wafers of the comparative examples.

Figure 3:
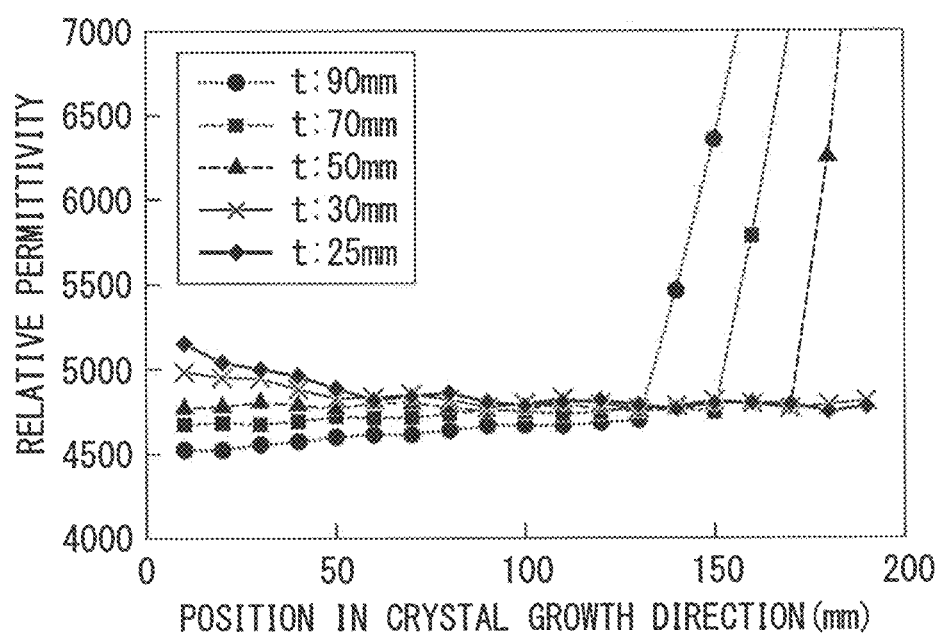
FIG. 3 is a graph showing a relationship between a position in a crystal growth direction and relative permittivity.

Next, in order to evaluate uniformity of a growth direction of the single crystal 7 (so-called, a longitudinal direction of the single crystal 7), a square substrate with a side of 10 mm was cut out at intervals of 10 mm along the growth direction of the single crystal 7, and Au electrodes were formed and then poled at 1000 V/mm to measure relative permittivity. The results are shown in FIG. 3. In a horizontal axis in FIG. 3, the upper end of the cone part 3 of the crucible 1 is defined as 0 mm.

It is apparent from FIG. 3, in Inventive Example 1 (the thickness t of the melt layer 5: 90 mm), the relative permittivity was stable from the upper end of the cone part 3 of the crucible 1 to a position of 130 mm, and the relative permittivity rapidly increased at a position exceeding 130 mm. In Inventive Example 2 (the thickness t of the melt layer 5: 70 mm), the relative permittivity was stable from the upper end of the cone part 3 of the crucible 1 to a position of 150 mm, and the relative permittivity rapidly increased at a position exceeding 150 mm. In Inventive Example 3 (the thickness t of the melt layer 5: 50 mm), the relative permittivity was stable from the upper end of the cone part 3 of the crucible 1 to a position of 170 mm, and the relative permittivity rapidly increased at a position exceeding 170 mm. The positions at which the relative permittivity rapidly increases correspond to a region where dropping of the melt 6 was stopped and the melt 6 was solidified at the end of the production process of the single crystal 7. Therefore, as the thickness t of the melt layer 5 increases, the region where the relative permittivity rapidly increases enlarges.

In Inventive Example 4 (the thickness t of the melt layer 5: 30 mm), the relative permittivity is stable from the upper end of the cone part 3 of the crucible 1 to a position of 190 mm.

In Comparative Example 1 (the thickness t of the melt layer 5: 25 mm), the relative permittivity is stable from the upper end of the cone part 3 of the crucible 1 to the position of 190 mm. However, as already explained, since a large number of defects existed, the problem of the present invention could not be solved.

In Comparative Example 2 (the thickness t of the melt layer 5: 20 mm), a large number of defects occurred in the single crystal 7 and it was difficult to cut out a substrate, so that the relative permittivity was not measured.

The range in which the stable relative permittivity shown in FIG. 3 was obtained is shown in Table 1 as a uniform characteristic length.

TABLE 1

|  | Amount of initial raw material (g) | Thickness t of melt layer (mm) | Number of cutouts (sheet/wafer) | Uniform characteristic length (mm) | Number of cutouts × Uniform characteristic length |
|---|---|---|---|---|---|
| Inventive Example 1 | 3671 | 90 | 34 | 130 | 4420 |
| Inventive Example 2 | 3057 | 70 | 34 | 150 | 5100 |
| Inventive Example 3 | 2140 | 50 | 34 | 170 | 5780 |
| Inventive Example 4 | 1429 | 30 | 34 | 190 | 6460 |
| Comparative Example 1 | 1205 | 25 | 15 | 190 | 2850 |
| Comparative Example 2 | 1022 | 20 | 0 | — | — |

As an index for comprehensively evaluating the presence or absence of a defect and the uniformity of relative permittivity described above, the number of cutouts in Table 1 and the uniform characteristic length are integrated and shown in Table 1. All of the inventive examples had high values, and both prevention of defects and uniformity of properties could be achieved at the same time.

Although a single crystal of PMN-PT has been described here, it is obvious that the present invention is also effective for the production of other single crystals (for example, PIN-PMN-PT) containing $PbTiO_3$ (so-called PT component), and single crystals obtained by adding Mn, Ca or the like to PMN-PT or PIN-PMN-PT.

INDUSTRIAL APPLICABILITY

According to the present invention, it is possible to prevent occurrence of defects in a single crystal and to produce a single crystal having uniform characteristics in a growth direction with a high yield, and thus industrially remarkable effects are exhibited.

REFERENCE SIGNS LIST

1 Crucible
2 Seed crystal
3 Cone part
4 Initial raw material
5 Melt layer
5a Upper surface of melt layer
5b Lower surface of melt layer
6 Melt
7 Single crystal

The invention claimed is:

1. A single crystal production method for producing a single crystal containing $PbTiO_3$ by a vertical Bridgman method while heating and melting a raw material to obtain a melt and supplying the melt, comprising:
   supplying an initial raw material in solid form to a cone part of a crucible and an adjacent region above said cone part,
   heating and melting the initial raw material in the crucible to form a melt layer on an upper side of a seed crystal, wherein said melt layer has a predetermined thickness of at least 30 mm in said adjacent region above said cone part,
   lowering the crucible in an environment having a temperature gradient in which the temperature at a lower section becomes lower,
   starting unidirectional solidification of said melt layer from a part coming into contact with the seed crystal,
   solidifying said melt layer up to an upper end face of the cone part,
   dropping the additional melt obtained by heating and melting a raw material in a sub-crucible into the crucible,
   lowering the crucible while maintaining said predetermined thickness of said melt layer in said adjacent region above said cone part by balancing and adjusting the speed of lowering the crucible and supply rate by dropping of the additional melt, and
   producing the single crystal.

2. The single crystal production method according to claim 1, wherein said predetermined thickness is set to 30 to 90 mm.

* * * * *